US009850576B2

(12) United States Patent
Baek et al.

(10) Patent No.: US 9,850,576 B2
(45) Date of Patent: Dec. 26, 2017

(54) ANTI-ARC ZERO FIELD PLATE

(75) Inventors: Jonghoon Baek, San Jose, CA (US); Edwin C. Suarez, Fremont, CA (US); Tsutomu Tanaka, Santa Clara, CA (US); Edward P. Hammond, IV, Hillsborough, CA (US); Jeonghoon Oh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1518 days.

(21) Appl. No.: 12/982,843

(22) Filed: Dec. 30, 2010

(65) Prior Publication Data
US 2011/0197814 A1 Aug. 18, 2011

Related U.S. Application Data

(60) Provisional application No. 61/304,599, filed on Feb. 15, 2010.

(51) Int. Cl.
| C23C 16/00 | (2006.01) |
| C23C 16/50 | (2006.01) |
| C23F 1/00 | (2006.01) |
| H01L 21/306 | (2006.01) |
| C23C 16/455 | (2006.01) |
| H01J 37/32 | (2006.01) |
| C23C 16/509 | (2006.01) |

(52) U.S. Cl.
CPC ...... *C23C 16/45565* (2013.01); *C23C 16/509* (2013.01); *H01J 37/3244* (2013.01); *H01J 37/32082* (2013.01); *H01J 37/32431* (2013.01)

(58) Field of Classification Search
USPC ...................................... 118/715; 156/345.34
See application file for complete search history.

(56) References Cited

U.S. PATENT DOCUMENTS

| 5,405,444 A | 4/1995 | Moslehi |
| 5,885,356 A * | 3/1999 | Zhao et al. ............ 118/723 ER |
| 6,477,980 B1 | 11/2002 | White et al. |

(Continued)

FOREIGN PATENT DOCUMENTS

| EP | 1118693 | 7/2001 |
| KR | 10-2006-0092886 | 8/2006 |
| WO | WO-2003015481 | 2/2003 |

OTHER PUBLICATIONS

The International Search Report and the Written Opinion dated Oct. 25, 2011 PCT/US2011/023934.

(Continued)

*Primary Examiner* — Karla A Moore
*Assistant Examiner* — Tiffany Z Nuckols
(74) *Attorney, Agent, or Firm* — Patterson + Sheridan LLP

(57) ABSTRACT

Embodiments of the present invention generally relate to apparatus for reducing arcing and parasitic plasma in substrate processing chambers. The apparatus generally include a processing chamber having a substrate support, a backing plate, and a showerhead disposed therein. A showerhead suspension electrically couples the backing plate to the showerhead. An electrically conductive bracket is coupled to the backing plate and spaced apart from the showerhead. The electrically conductive bracket may include a plate, a lower portion, an upper portion, and a vertical extension. The electrically conductive bracket contacts an electrical isolator.

12 Claims, 9 Drawing Sheets

(56) References Cited

U.S. PATENT DOCUMENTS

| | | |
|---|---|---|
| 6,772,827 B2 | 8/2004 | Keller et al. |
| 6,823,589 B2 | 11/2004 | White et al. |
| 7,017,269 B2 | 3/2006 | White et al. |
| 7,429,410 B2 | 9/2008 | Keller et al. |
| 7,484,473 B2 | 2/2009 | Keller et al. |
| 2002/0069968 A1 | 6/2002 | Keller et al. |
| 2003/0066607 A1 | 4/2003 | White et al. |
| 2004/0118345 A1 | 6/2004 | White et al. |
| 2005/0000432 A1 | 1/2005 | Keller et al. |
| 2005/0183827 A1 | 8/2005 | White et al. |
| 2006/0228496 A1 | 10/2006 | Choi et al. |
| 2008/0099146 A1* | 5/2008 | Keller ............... 156/345.34 |
| 2009/0233424 A1 | 9/2009 | Ye |
| 2009/0324828 A1 | 12/2009 | Kato et al. |

OTHER PUBLICATIONS

Taiwan Office Action dated May 27, 2015 for Application No. TW 100104803.
Korean Office Action dated Dec. 21, 2016 for Application No. 10-2012-7024268.

* cited by examiner

ANTI-ARC ZERO FIELD PLATE

CROSS-REFERENCE TO RELATED APPLICATIONS

This application claims benefit of U.S. Provisional Patent Application Ser. No. 61/304,599, filed Feb. 15, 2010, which is herein incorporated by reference.

BACKGROUND OF THE INVENTION

Field of the Invention

Embodiments of the invention herein generally relate to generating plasma in a substrate processing chamber.

Description of the Related Art

As the demand for larger flat panel displays and solar panels increases, so must the size of the substrate to be processed. For example, a large area substrate may exceed 2 square meters in surface area. To process these large area substrates, chamber size must also increase. For a plasma enhanced chemical vapor deposition (PECVD) chamber, the backing plate is naturally going to be at least as large as the large area substrate. Hence, in a PECVD apparatus for processing large area substrates, the backing plate may exceed 2 square meters in surface area. With an increase in backing plate size, an increase in RF current is sometimes necessary.

In PECVD, process gases may be introduced into the process chamber through a showerhead and ignited into a plasma by an RF current applied to the showerhead. As substrate sizes increase, the RF current applied to the showerhead may also correspondingly increase. A larger RF current increases the likelihood of arcing or parasitic plasma forming in undesired locations of the PECVD chamber. Arcing and parasitic plasma usurp RF current from the desired substrate process, making substrate processing more costly and less efficient.

Therefore, there is a need to control unwanted arcing and the formation of parasitic plasma.

SUMMARY OF THE INVENTION

Embodiments of the present invention generally relate to apparatus for reducing arcing and parasitic plasma in substrate processing chambers. The apparatus generally include a processing chamber having a substrate support, a backing plate, and a showerhead disposed therein. A showerhead suspension electrically couples the backing plate to the showerhead. An electrically conductive bracket is coupled to the backing plate and spaced apart from the showerhead. The electrically conductive bracket may include a plate, a lower portion, an upper portion, and a vertical extension. The electrically conductive bracket contacts an electrical isolator.

In one embodiment, a vacuum processing chamber comprises a backing plate disposed in a chamber body and a showerhead disposed in the chamber body and coupled to the backing plate. The vacuum processing chamber also comprises one or more showerhead suspensions electrically coupling the backing plate to the showerhead, and an electrically conductive bracket coupled to the backing plate and spaced apart from the showerhead suspension. The electrically conductive bracket comprises a plate positioned substantially perpendicular to a face of the showerhead. The vacuum processing chamber also comprises an electrical isolator having a first side contacting the plate of the electrically conductive bracket and a second side contacting the chamber body.

In another embodiment, a processing chamber comprises a chamber body, a chamber lid positioned on the chamber body, and a backing plate coupled to the chamber lid. A showerhead is coupled to the backing plate, and an RF source is coupled to the showerhead. An electrically conductive bracket is coupled to the backing plate and spaced apart from the showerhead. The electrically conductive bracket comprises a plate positioned substantially perpendicular to a face of the showerhead, and a lower portion coupled to a bottom edge of the plate. The lower portion is substantially perpendicular to the plate. The electrically conductive bracket also includes an upper portion extending from the plate and positioned parallel with the lower portion. A first electrical isolator comprising polytetrafluoroethylene is positioned proximate to the backing plate, the chamber body, and the showerhead. The electrical isolator has a first side contacting the chamber body, and a second side contacting the plate of the electrically conductive bracket.

In another embodiment, a processing chamber comprises a chamber body, a lid disposed on the chamber body, and a showerhead disposed in the chamber body. The processing chamber also comprises an electrically conductive bracket electrically coupled to the showerhead. The electrically conductive bracket is disposed laterally outward of the showerhead and in a spaced apart relation to the showerhead. An electrical insulator is disposed against the electrically conductive bracket. The electrical insulator is positioned laterally outward of the electrically conductive bracket and is in contact with the chamber body.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to apparatus for reducing arcing and parasitic plasma in substrate processing chambers. The apparatus generally include a processing chamber having a substrate support, a backing plate, and a showerhead disposed therein. A showerhead suspension electrically couples the backing plate to the showerhead. An electrically conductive bracket is coupled to the backing plate and spaced apart from the showerhead. The electrically conductive bracket may include a plate, a lower portion, an upper portion, and a vertical extension. The electrically conductive bracket contacts an electrical isolator.

Embodiments discussed herein may be practiced in a PECVD chamber available from AKT America, a subsidiary of Applied Materials, Inc., Santa Clara, Calif. It is to be understood that the embodiments discussed herein may be practiced in other processing systems, including those sold by other manufacturers.

Figure 1:
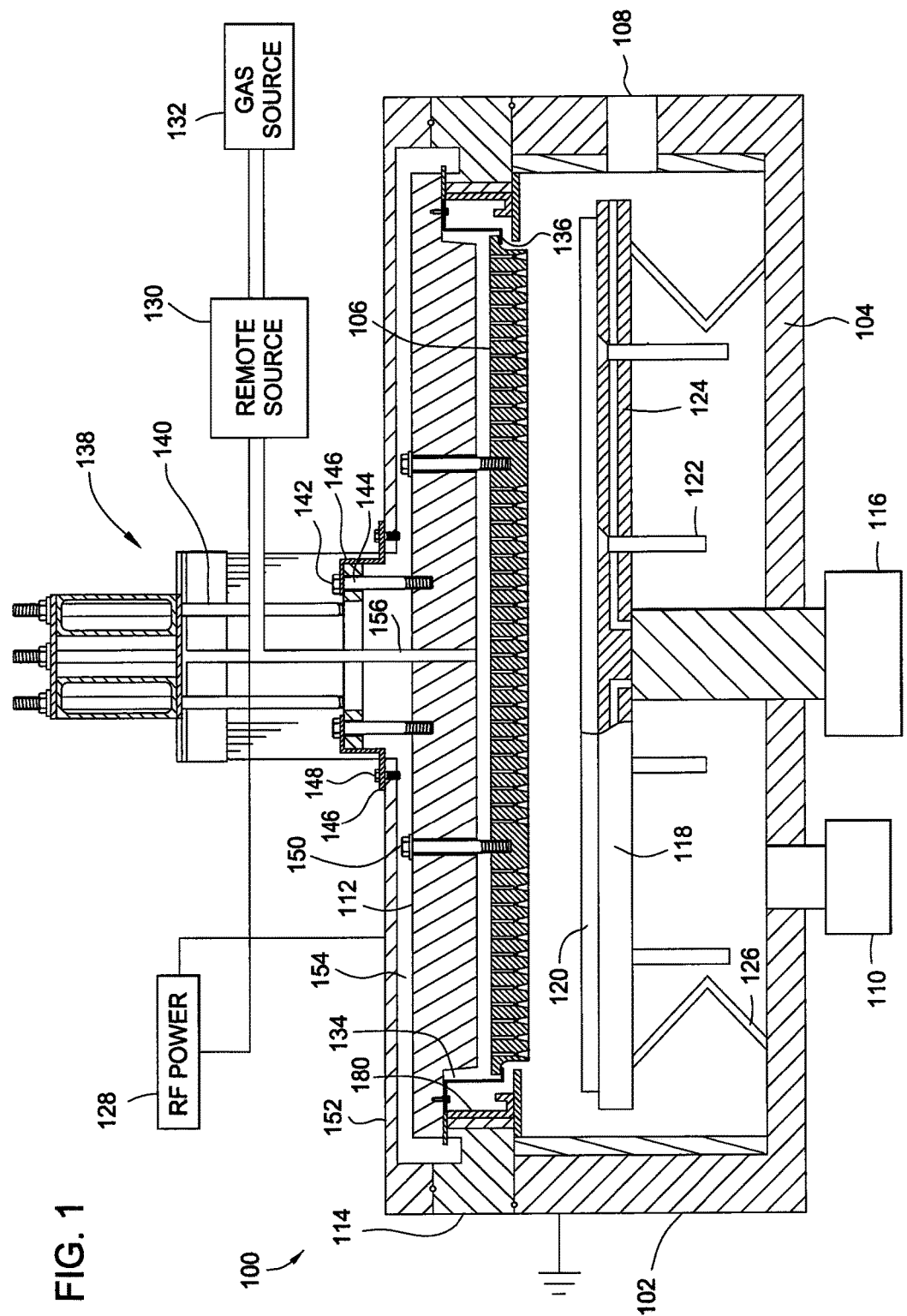
FIG. 1 is a cross sectional view of a PECVD apparatus according to one embodiment of the invention.

FIG. 1 is a cross sectional view of a PECVD apparatus according to one embodiment of the invention. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 may also include RF return straps 126 to provide an RF return path at the periphery of the substrate support 118.

The showerhead 106 is coupled to a backing plate 112 by a fastening mechanism 150. The showerhead 106 may be coupled to the backing plate 112 by one or more fastening mechanisms 150 to help prevent sag and/or control the straightness/curvature of the showerhead 106. In one embodiment, twelve fastening mechanisms 150 may be used to couple the showerhead 106 to the backing plate 112. The fastening mechanisms 150 may include a nut and bolt assembly. In one embodiment, the nut and bolt assembly may be made with an electrically insulating material. In another embodiment, the bolt may be made of a metal and surrounded by an electrically insulating material. In still another embodiment, the showerhead 106 may be threaded to receive the bolt. In yet another embodiment, the nut may be formed of an electrically insulating material. The electrically insulating material helps to prevent the fastening mechanisms 150 from becoming electrically coupled to any plasma that may be present in the chamber 100.

A gas source 132 is coupled to the backing plate 112 to provide gas through gas passages in the showerhead 106 to a processing area between the showerhead 106 and the substrate 120. A vacuum pump 110 is coupled to the chamber 100 to control the process volume at a desired pressure. An RF source 128 is coupled to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118. Various frequencies may be used, such as a frequency between about 0.3 MHz and about 200 MHz. In one embodiment, the RF current is provided at a frequency of 13.56 MHz.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106. Suitable cleaning gases include but are not limited to $NF_3$, $F_2$, $SF_6$ and $Cl_2$. The spacing between the top surface of the substrate 120 and the showerhead 106 may be between about 400 mil and about 1,200 mil. In one embodiment, the spacing may be between about 400 mil and about 800 mil.

The backing plate 112 may be supported by a support assembly 138. One or more anchor bolts 140 may extend down from the support assembly 138 to a support ring 144. The support ring 144 may be coupled with the backing plate 112 by one or more fastening mechanisms 142. In one embodiment, the fastening mechanisms 142 may comprise a nut and bolt assembly. In another embodiment, the fastening mechanisms 142 may comprise a threaded bolt coupled with a threaded receiving surface of the backing plate 112. The support ring 144 may be coupled with the backing plate 112 substantially in the center of the backing plate 112. The center of the backing plate 112 is the area of the backing plate 112 with the least amount of support in absence of the support ring 144. Therefore, supporting the center area of the backing plate 112 may reduce and/or prevent sagging of the backing plate 112. In one embodiment, the support ring 144 may be coupled to an actuator that controls the shape of the backing plate 112 so that the center of the backing plate 112 may be raised or lowered relative to the edges of the backing plate 112. The movement of the backing plate 112 may occur in response to a metric obtained during processing. In one embodiment, the metric is the thickness of the layer being deposited. In another embodiment, the metric is the composition of the layer deposited. The movement of the backing plate 112 may occur simultaneous with the processing. In one embodiment, the one or more fastening mechanisms 142 may extend through the backing plate 112 to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest, and is in electrical communication with an electrically conductive bracket 180. The backing plate 112 may rest on an upper surface of a ledge 114 coupled with the chamber walls 102 to seal the chamber 100. A chamber lid 152 may be coupled with the chamber walls 102 and spaced from the backing plate 112 by area 154. In one embodiment, the area 154 may be an open space (e.g., a gap between the chamber walls and the backing plate 112). In another embodiment, the area 154 may be an electrically insulating material. The chamber lid 152 may have an opening therethrough to permit the one or more fastening mechanisms 142 to couple with the backing plate 112 and the gas feed conduit 156 to supply processing gas to the chamber 100. In one embodiment, the support ring 144 may be disposed below the chamber lid 152 and substantially centered within the opening of the chamber lid 152.

An RF return plate 146 may be coupled with the ring 144 and the chamber lid 152. The RF return plate 146 may be coupled with the chamber lid 152 by a fastening mechanism 148. In one embodiment, the fastening mechanism 148 comprises a lag screw. The RF return plate 146 may be coupled between the fastening mechanism 142 and the ring 144. The RF return plate 146 provides a return path to the RF source 128 for any RF current that may travel up the fastening mechanism 142 to the ring 144. The RF return plate 146 provides a path for the RF current to flow back down to the chamber lid 152 and then to the RF source 128.

Figure 2A:
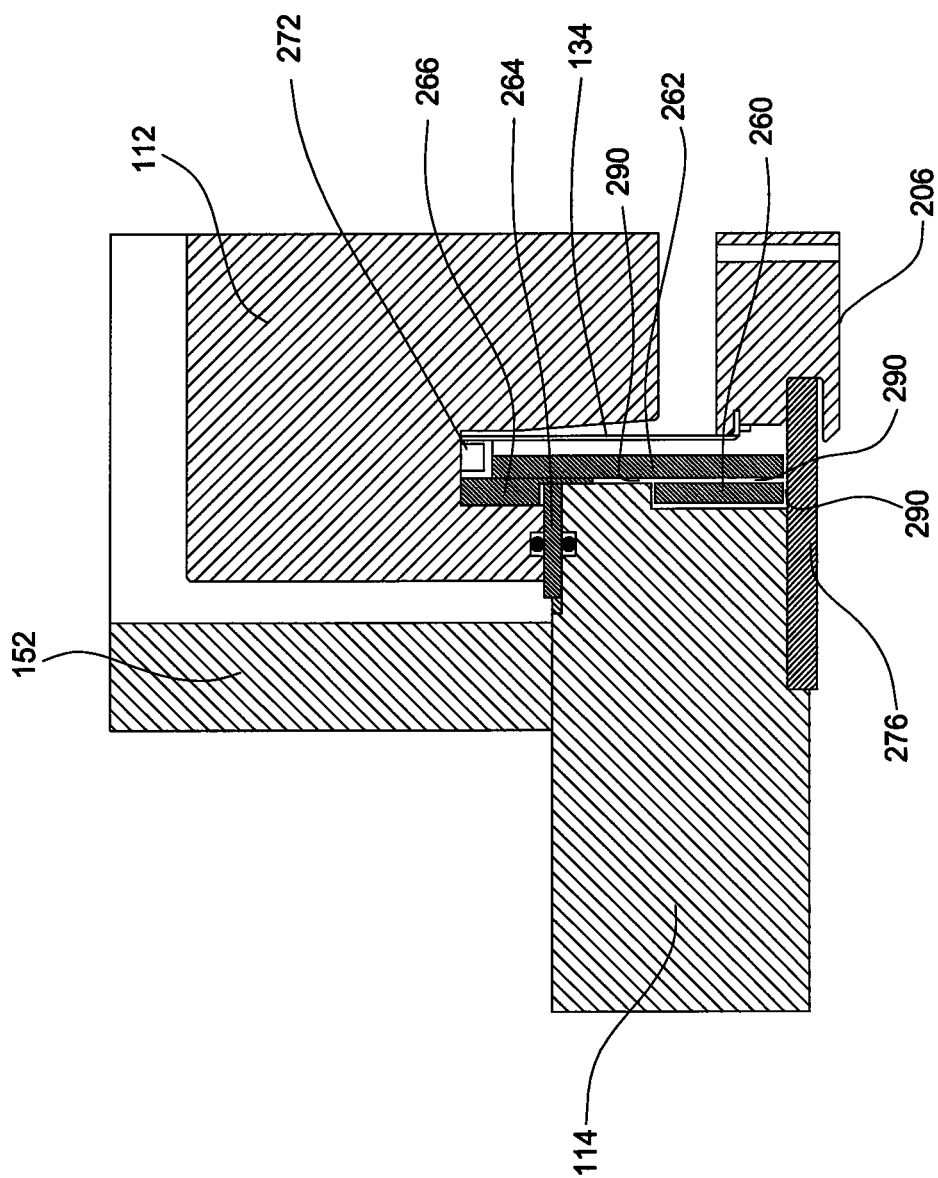
FIG. 2A is a schematic illustration of a backing plate coupled to a showerhead.

FIG. 2A is a schematic illustration of a backing plate coupled to a showerhead. The showerhead suspension 134 is coupled between the backing plate 112 and the showerhead 206. The showerhead suspension 134 is generally made from an electrically conductive material, such as aluminum, in order to electrically couple the showerhead 206 to the backing plate 112. The showerhead suspension 134 is connected to the backing plate 112 by a fastening assembly 272. The Fastening assembly 272 may be a threaded bolt, screws or a weld. In one embodiment, the fastening assembly 272 may also include a spring or other tension mechanism.

The backing plate 112 is disposed upon the upper surface of the ledge 114. The ledge 114 is coupled to or is an integral part of the chamber body, and is in electrical communication with chamber walls. The ledge 114 also supports the chamber lid 152 on an upper surface of the ledge 114. The chamber lid 152 and the ledge 114 are also generally in electrical communication with one another.

The ledge 114 is electrically insulated from the backing plate by electrical isolators 260, 262, 264, 266. The electrical isolators 260, 262, 264, 266 may be an electrically insulating material such as polytetrafluoroethylene (e.g., TEFLON® polymer), or may comprise an electrically insulating material coated with polytetrafluoroethylene. Suitable electrically insulating materials for coating may include ceramic, alumina, or other dielectric materials. The electrical isolators 260, 262, and 266 are present to fill voids which assist in minimizing potential arcing. When present, the electrical isolators 260, 262, and 266 may provide electrical isolation between the ledge 114, the showerhead 206 and the backing plate 112. The embodiment of FIG. 2A additionally includes an optional electrical isolator 276. Electrical isolator 276 contacts the ledge 114 and the showerhead 206, and provides electrical isolation therebetween. The electrical isolator 276 may also provide support for the electrical isolators 260 and 262, or may contain process gases from flowing around the showerhead 106 and into undesired regions of the process chamber.

In the embodiment of FIG. 2A, spaces 290 are present between the electrical isolators 260, 262, 264, 266, the ledge 114, the backing plate 112, and the electrical isolator 276. The spaces 290 are incorporated in part to allow for thermal expansion during processing. The spaces 290 also create potential locations where arcing and parasitic plasma may form, due to the method in which RF power is applied to the process chamber.

RF power travels throughout a processing system by means of the "skin effect," e.g., RF current travels over the surface of electrically conductive components. In the embodiment of FIG. 2A, RF current flows from an RF source (not shown), over the surface of the backing plate 112 that faces the lid 152, down the surface of the showerhead suspension 134 that faces the electrical isolator 262, and over the surface of the showerhead 206 that faces the processing area. The RF current is then capacitively-coupled through a plasma generated in the processing region of the processing chamber, to the substrate support. The RF current then seeks to return to the RF source by traveling down the substrate support or grounding straps, and up the chamber body walls to the RF source. RF current flowing from the RF source shall be referred to as "RF hot", and RF current returning to the RF source shall be referred to as "RF return."

Since the ledge 114 is coupled to, or is part of the chamber body, the ledge 114 is part of the RF return path. Conversely, the showerhead suspension 134 is "RF hot," since RF power is being applied from an RF source, across the showerhead suspension 134 to the capacitively coupled plasma in the processing region. The spaces 290 are located between the ledge 114, which is an RF return path, and the showerhead suspension 134, which is RF hot. Thus, an electric potential exists across the spaces 290. Therefore, if process gases are located in the spaces 290, then it is possible for the electric potential across the ledge 114 and the showerhead suspension 134 to arc or form a parasitic plasma within the spaces 290. This is an undesired effect which usurps RF power from the desired process, causing the desired process to be less efficient and more expensive.

Figure 2B:
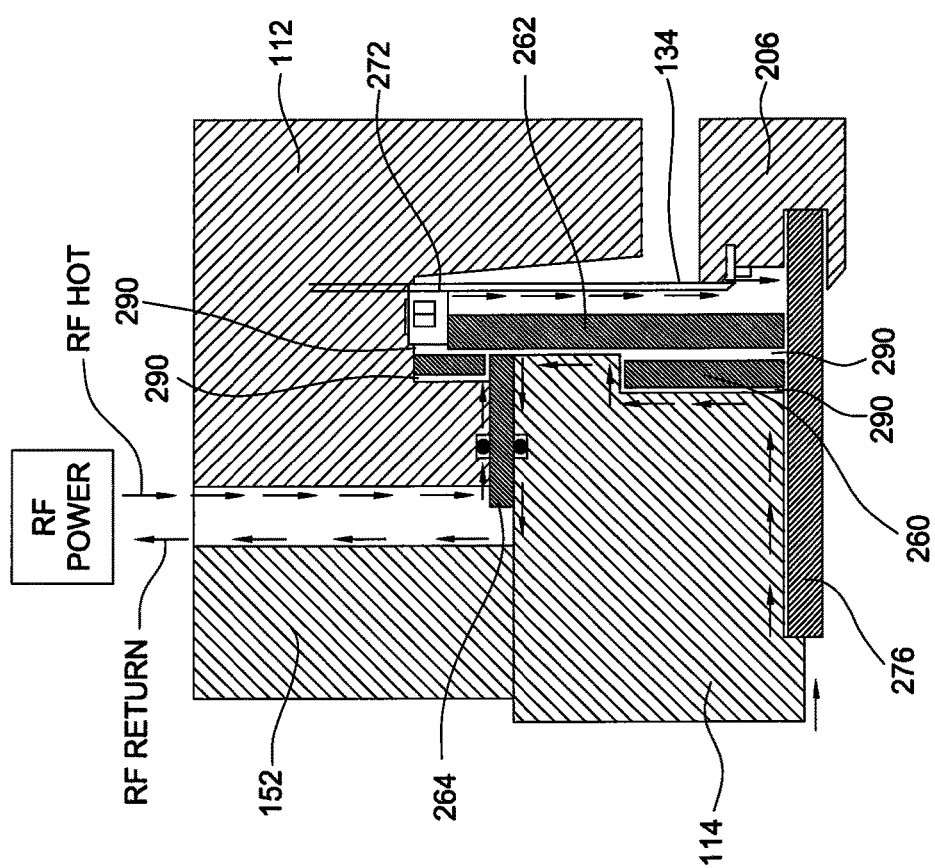
FIG. 2B is a schematic illustration of a backing plate coupled to a showerhead.

FIG. 2B is a schematic illustration of a backing plate coupled to a showerhead. The spaces 290 are located between the ledge 114, which is an RF return path, and the showerhead suspension 134, which is RF hot. The RF hot arrows indicate the RF current being supplied to a capacitively coupled plasma which would be present in the processing region of the process chamber. The RF current flows from the RF source over the backing plate 112, over the fastening assembly 272 and down the showerhead suspension 134, and across the showerhead 206. The RF return arrows indicate the path of the RF current returning to the RF source. The RF return current flows over the ledge 114 and up the chamber lid 152 until the RF current returns to the RF source.

As can be seen in FIG. 2B, the spaces 290 have RF hot current on one side, and RF return current on another. This creates a potential across the spaces 290; if any process gas is present in the spaces 290, the process gas may ignite into a parasitic plasma and arcing may result. A void as small as 1 mm is sufficient to permit arcing or parasitic plasma if there is sufficient potential across the space. Therefore, it is desirable to eliminate the spaces 290.

Figure 3:
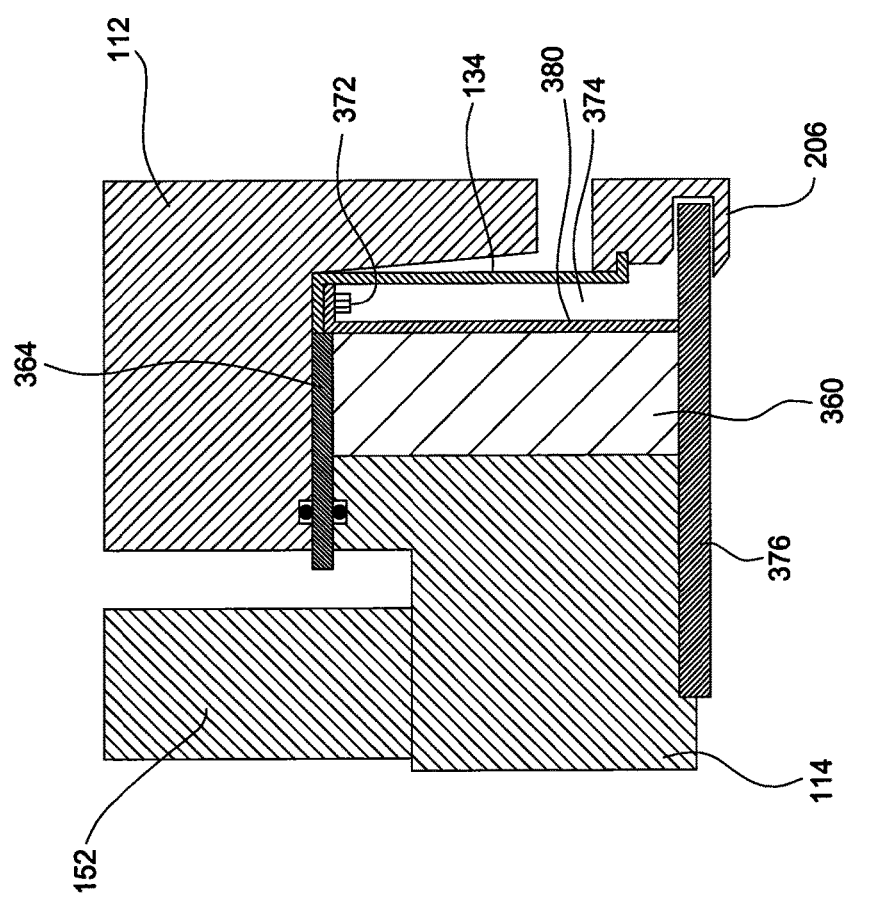
FIG. 3 is a schematic illustration of a backing plate coupled to a showerhead.

FIG. 3 is a schematic illustration of a backing plate coupled to a showerhead. Showerhead suspension 134 is coupled between the backing plate 112 and the showerhead 206, and may be flexible. Showerhead suspension 134 is generally made from an electrically conductive material, such as aluminum, and electrically couples showerhead 206 to the backing plate 112. Showerhead suspension 134 is connected to the backing plate 112 by fastening assembly 372. In the embodiment shown in FIG. 3, the fastening assembly 372 is a bolt adapted to be threaded into backing plate 112.

Backing plate 112 is disposed upon the upper portion of ledge 114. In the embodiment of the FIG. 3, the ledge 114 is part of the chamber wall. The ledge 114 is electrically insulated from the backing plate by electrical isolators 360, 364, and supports chamber lid 152. The electrical isolators 360, 364 may be an electrically insulating material such as TEFLON® polymer, or material coated with TEFLON® polymer. Suitable electrically insulating materials that may be coated include ceramic, alumina, or other dielectric materials. In one embodiment, the electrical isolator 360 is a dielectric insert. Electrical isolator 376 is positioned between the ledge 114 and the showerhead 206. The Electrical isolator 376 may assist in supporting the electrical isolator 360, may prevent arcing between chamber components, and may contain processes gasses in a region above the showerhead 206.

The electrical isolator 360 abuts the ledge 114 on one side, and the electrically conductive bracket 380 on the opposite side. The electrically conductive bracket 380 may be flexible and comprise an electrically conductive material, for example, a metal such as aluminum or other suitable material. In one embodiment, there are no spaces between the electrical isolator 360 and the ledge 114, or between the electrical isolator 360 and the electrically conductive bracket 380. The electrically conductive bracket 380 should be sufficiently rigid to remain in contact with the electrical isolator 360, but flexible enough to allow for thermal expansion during processing. The electrically conductive bracket 380 is held in position by the fastening assembly 372, which may include a screw or bolt to fasten the electrically conductive bracket 380 securely in place. In the embodiment shown in FIG. 3, the fastening assembly 372 secures the showerhead suspension 134 and the electrically conductive bracket 380 to the backing plate 112 using a bolt disposed through holes in the upper portions of the showerhead suspension 134 and the electrically conductive bracket 380.

Ideally, there are no spaces present between the electrical isolator 360 and ledge 114, or between the electrical isolator 360 and the electrically conductive bracket 380. However, due to machining tolerances and allowance of thermal expansion, some spaces may present during substrate processing. It is desirable that any spaces present are less than about 1 millimeter. The use of a single electrical isolator, such as the electrical isolator 360, assists in further reducing the amount of spaces or gaps which would normally be present when using multiple electrical isolators. Therefore, during plasma processing of a substrate, even though an electric potential may exist across the electrical isolator 360 due to the RF return and RF hot currents, there are no spaces for a parasitic plasma or arcing to occur. High density electric fields emanating from the bracket 380 are located within the electrical isolator 360, where arcing cannot occur.

The electrically conductive bracket 380 and the showerhead suspension 134 are in electrical communication near the fastening assembly 372. The space 374 is present between the electrically conductive bracket 380 and the showerhead suspension 134. However, since the electrically conductive bracket 380 and the showerhead suspension 134 are in electrical communication, and provide a pathway for the RF hot current to reach the capacitively coupled plasma in the processing region, there is no potential or negligible potential across the space 374. Thus, even though a gap or space exists, arcing should not occur since the electric potential across the electrically conductive bracket 380 and the showerhead suspension 134 is negligible. Therefore, it is desirable that the electric field to the right of the electrical isolator 360, e.g., between the electrically conductive bracket 380 and the showerhead suspension 134, is about zero.

In the embodiment of FIG. 3, RF hot current is present on the right side of the electrical isolator 360, and RF return current is present on the left side of the electrical isolator 360 as the return current travels over the surface of the ledge 114. The RF hot current on the right side of the electrical isolator 360 and the RF return current on the left side of the electrical isolator 360 create an electric potential across the electrical isolator 360. As discussed above, electric potentials may generate arcing or parasitic plasmas when there are voids or spaces present. However, in this embodiment, the electrical isolator 360 completely occupies all the spaces between the ledge 114 (having an RF return current thereon) and the electrically conductive bracket 380 (having an RF hot current thereon). Parasitic plasmas and arcing generally do not occur in spaces occupied by solid material, therefore, the electric potential which is present is acceptable for substrate processing, since arcing should not occur.

In one embodiment, substantially all of the side of the electrically conductive bracket 380 facing the electrical isolator 360 is in contact with the electrical isolator 360. Likewise, all of the side of the electrical isolator 360 facing the ledge 114 is in contact with the ledge 114. Since the surfaces of the electrical isolator 360 are substantially in contact with the conductive bracket 380 and the ledge 114, and since the electrical isolator 360 can accommodate thermal expansion, there are no gaps therebetween. Therefore, there are no places for arcing or parasitic plasmas to occur. The electrical isolator 360 is sized and shaped to remove substantially all spaces or voids present between the electrically conductive bracket 380 and the ledge 114. However, even if small voids or gaps do form because of thermal expansion, the potential for arcing is greatly reduced due to the decreased RF voltage across the sheath as a result of the electrical isolator 360.

Figure 4:
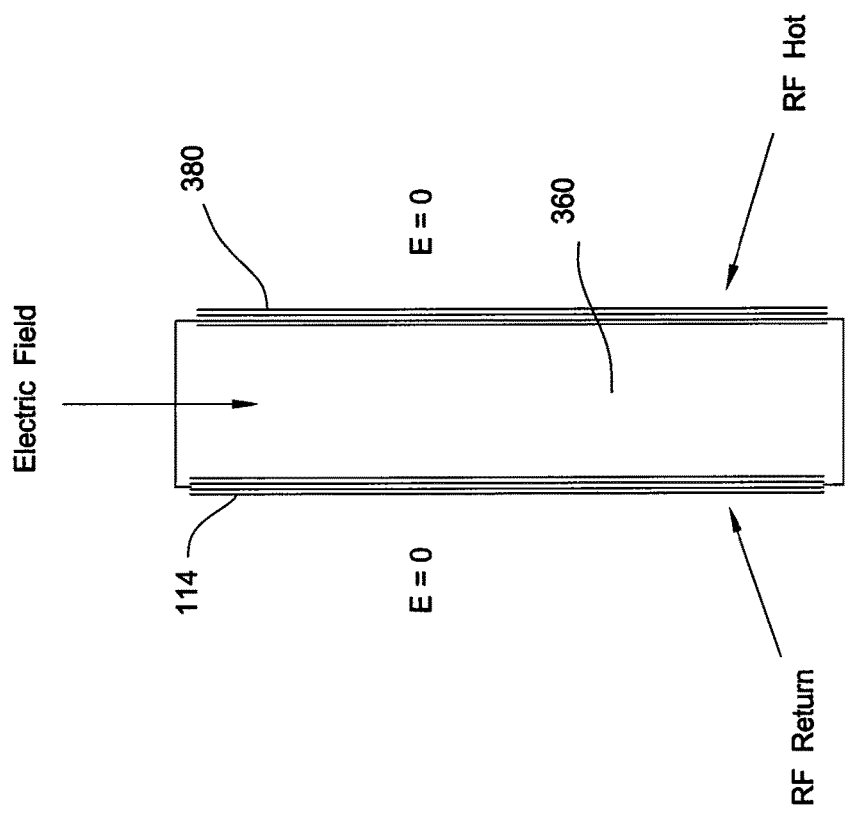
FIG. 4 is a diagram of an electric field through and around an electrical isolator.

FIG. 4 is a diagram of an electric field through and around the electrical isolator 360. RF hot current travels over a backing plate and a showerhead to a processing region, where the RF current is then capacitively coupled to a substrate support. The RF hot current travels over and proximate to the electrically conductive bracket 380, as illustrated on the right side of FIG. 4. RF current returns to an RF source by traveling over the chamber body and the ledge 114, which is in electrical communication with the chamber body.

Since only RF hot current is present to the right of the electrically conductive bracket 380, no electric potential is created in this area, as designated with E=0. Similarly, since only RF return current is present to the left of the ledge 114, there is also no electric potential in this area of the chamber. Absent an electric potential, arcing and parasitic plasma should not occur. The only place in the embodiment of FIG. 4 where an electric potential exists is across the electrical isolator 360. However, the electrical isolator 360 is an electrically insulating material, such as ceramic or alumina, which completely occupies the space between the electrically conductive bracket 380 and the ledge 114. As explained above, arcing should only occur in spaces or voids within chamber. Thus, since the electrical isolator 360 occupies the space between the electrically conductive bracket 380 and the ledge 114, there is no space for arcing to occur. Therefore, even though an electric potential exists across the electrical isolator 360, arcing and plasma will not occur in the space occupied by the electrical isolator 360.

Figure 5:
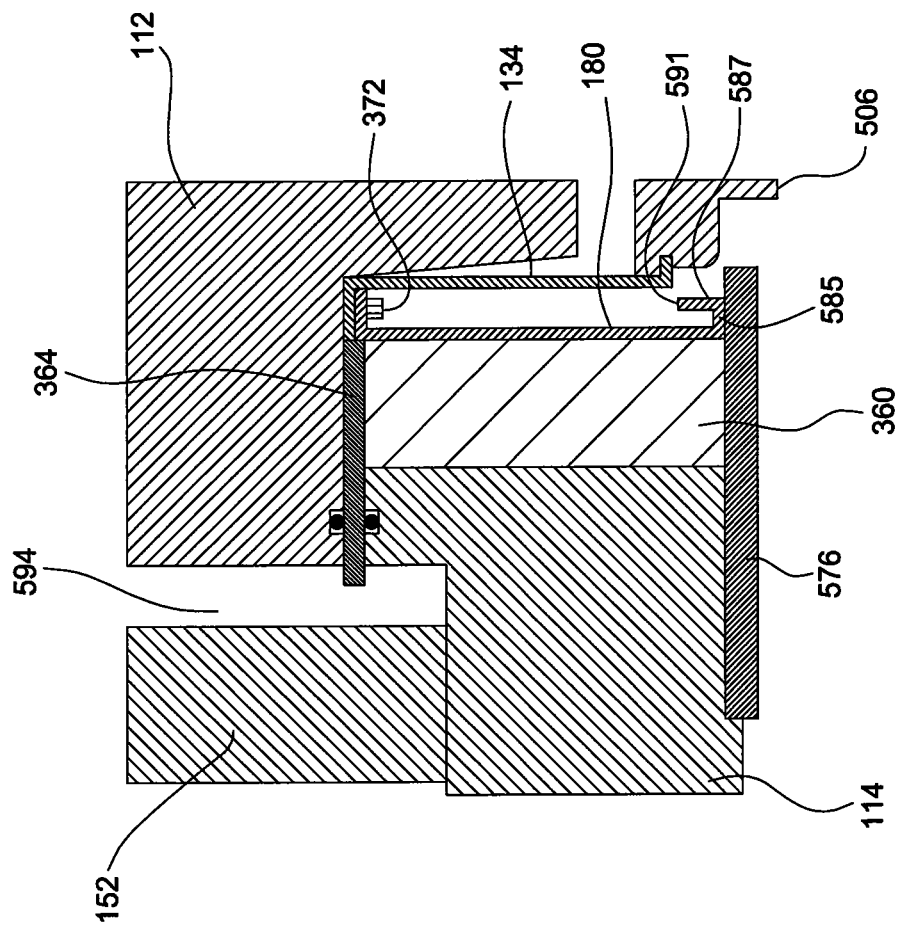
FIG. 5 is a schematic illustration of a backing plate coupled to a showerhead.

FIG. 5 is a schematic illustration of a backing plate coupled to a showerhead. The showerhead suspension 134 is coupled between the backing plate 112 and the showerhead 506. The showerhead suspension 134 is formed from an electrically conductive material, and is connected to the backing plate 112 by the fastening assembly 372. The fastening assembly 372 may include a bolt to secure the electrically conductive bracket 180 and the showerhead suspension 134 to the backing plate 112. Additionally, the fastening assembly 372 holds the electrically conductive bracket 180 in position against the surface of the electrical isolator 360. The electrical isolator 576 is positioned below and in contact with the electrical isolator 360, and may contain processes gases behind the showerhead 506. The ledge 114 is part of the chamber body, and provides a return path for the RF current to return to the RF source. Additionally, the ledge 114 provides support for the chamber lid 152, which is disposed on an upper surface of the ledge 114. The chamber lid 152 and the backing plate 112 are separated by a space 594.

The backing plate 112 remains electrically isolated from the ledge 114 by the electrical isolator 364. The electrical isolator 364 may be held in position by the weight of the backing plate 112, or may be secured by the fastening assembly 372. Since RF return current travels over the ledge 114, and RF hot current travels over the backing plate 112, a potential exists across the electrical isolator 364. However, since the electrical isolator 364 occupies all the space between the ledge 114 and the backing plate 112, there are no places for arcing to occur. The surfaces of the backing plate 112 and the ledge 114 in contact with the electrical isolator 364 have minimal gaps or no gaps therebetween. In one embodiment, gaps present between the backing plate 112 and the electrical isolator 364 are less than 1 millimeter.

In the embodiment shown in FIG. 5, the electrically conductive bracket 180 is fixedly attached to the electrical isolator 360 by the fastening assembly 372, which includes a bolt threaded into the backing plate 112. The electrically conductive bracket 180 is similar to the electrically conductive bracket 380 (shown in FIG. 3), however, the electrically conductive bracket 180 includes an additional lower portion 585 extending perpendicularly from a bottom edge of the electrically conductive bracket 180, and a vertical extension 587 coupled to the lower portion 585. The electrically conductive bracket 180 not only assists in reducing arcing at locations to the left of the electrically conductive bracket 180 by removing voids or gaps, but also reduces arcing which may occur to the right or below the electrically conductive bracket 180 by moving a distal tip 591 (the end of the vertical extension 587) of the electrically conductive bracket 180 to a position of negligible electric field.

Referring to the electrically conductive bracket 380 of FIG. 3, the lowest edge produces a relatively sharp corner surface and is RF hot. Sharp surfaces can often induce arcing due to the high electric field at these points. Chamber components, such as the chamber wall provide a path for RF return current. Therefore, it is possible for arcing to occur from the sharp surfaces of the electrically conductive bracket 380 to other chamber components, such as the chamber wall.

However, the likelihood of arcing occurring can be reduced by moving the sharp edge of the electrically conductive bracket 380 away from the RF return current to a position within a negligible electric field. Referring back to the electrically conductive bracket 180 of FIG. 5, the lower portion 585 and the vertical extension 587 have been added. The lower portion 585 and the vertical extension 587 of the electrically conductive bracket 180 are positioned between the electrical isolator 360 and the showerhead suspension 134, and extend in a direction toward a similar electrical potential (e.g., towards the showerhead 506 and the showerhead suspension 134 which are also RF hot). Thus, even though the distal tip 591 of electrically conductive bracket 180 is still a relatively sharp point, the tip 591 is positioned in a place of negligible or no electric field. Since the electric field is negligible and all surrounding chamber components are approximately the same electric potential, the potential for arcing is greatly reduced.

Figure 6A:
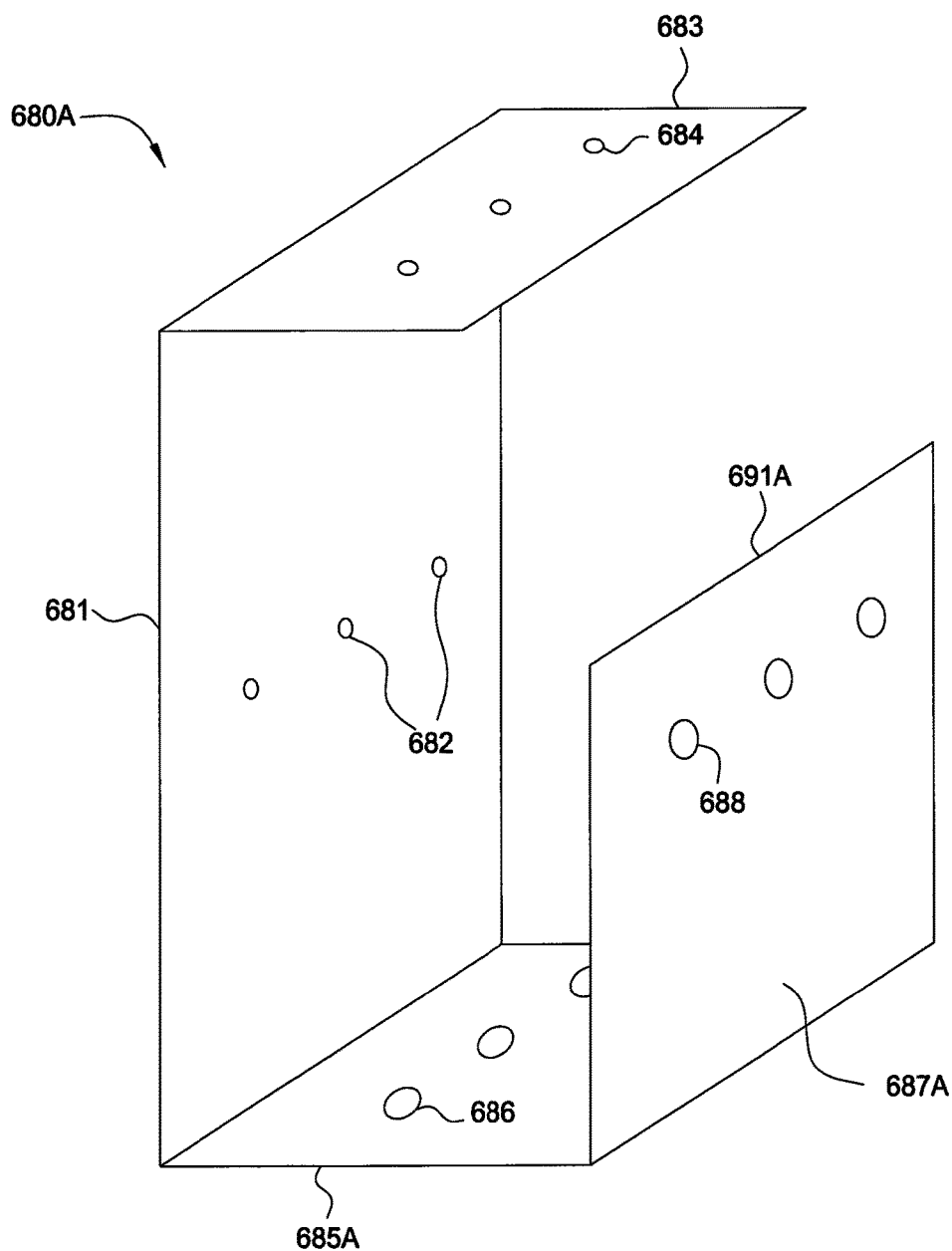
FIGS. 6A-6G are perspective views of a electrically conductive brackets.

FIGS. 6A-6G are perspective views of electrically conductive brackets. FIG. 6A illustrates an electrically conductive bracket 680A configured to reduce the potential for arcing by positioning a distal tip 691A in a place of negligible electric field. The electrically conductive bracket 680A includes a plate 681, an upper portion 683, a lower portion 685A, and a vertical extension 687A. The plate 681 is substantially parallel to vertical extension 687A, and substantially perpendicular to the upper portion 683 and the lower portion 685A. The electrically conductive bracket 680A is constructed from a single piece of material. In another embodiment, the bracket may be formed from multiple pieces of material coupled to one another by welding, riveting, or any other suitable manner which maintains the electrical conductivity through the entire bracket 680A. Additionally, depending on the size or shape of other processing chamber components, the electrically conductive bracket 680A may be formed into other shapes, including rounded or semi-circular shapes.

The electrically conductive bracket 680A is generally positioned within a process chamber such that the vertical extension 687A is located between the plate 681 and a showerhead suspension (not shown) or showerhead (not shown). The backside of the plate 681 is adapted to contact an electrical isolator (not shown), such as the electrical isolator 360 (FIG. 3), and can be coupled thereto by screws or bolts disposed through holes 682. Holes 688 formed in the vertical extension 687A are radially aligned with the holes 682 of the plate 681, thereby permitting a tool to pass through the holes 688 to access a fastener utilized to engage the holes 682 to secure bracket 680A to an electrical isolator. Likewise, the holes 686 disposed in the lower portion 685A permit a tool to access a fastener utilized to engage the holes 684 of the upper portion 683 for securing the electrically conductive bracket 680A. For example, a fastening assembly (not shown) may be disposed through the holes 684 to position and maintain the electrically conductive bracket 680A within the chamber. In embodiments where the electrically conductive bracket 680A is secured in a processing chamber other than by screws or bolts, holes 682, 684, 686 and 688 may not be necessary.

Since electrically conductive bracket 680A includes at least a lower portion 685A and optionally a vertical extension 687A, the potential for the occurrence of arcing is greatly reduced. In the embodiment of FIG. 6A, the sharpest edge of electrically conductive bracket 680A is the vertical extension 687A. However, the upper portion of the vertical extension 687A would be located between the plate 681 and a showerhead suspension (not shown), both of which are of similar electric potential. Thus, since the vertical extension 687A, the plate 681, and the showerhead suspension would all be of similar potential, the electric field at the upper end of the vertical extension 687A is negligible, and arcing is unlikely to occur even though the vertical extension 687A terminates at a relatively sharp edge. The length and height of the lower portion 685A and the vertical extension 687A are not critical, but generally the electric field and thus the likelihood of arcing is further reduced as the endpoint of the lower part of the bracket (or the vertical extension) is moved further from the bottom of the plate 681 (and thus further from the RF return path). In the embodiment shown in FIG. 6A, the electrically conductive bracket 680A provides an electric field intensity reduction of about 98 percent at the distal end of the vertical extension 687A when compared to an electrically conductive bracket lacking a lower portion and a vertical extension.

Figure 6B:
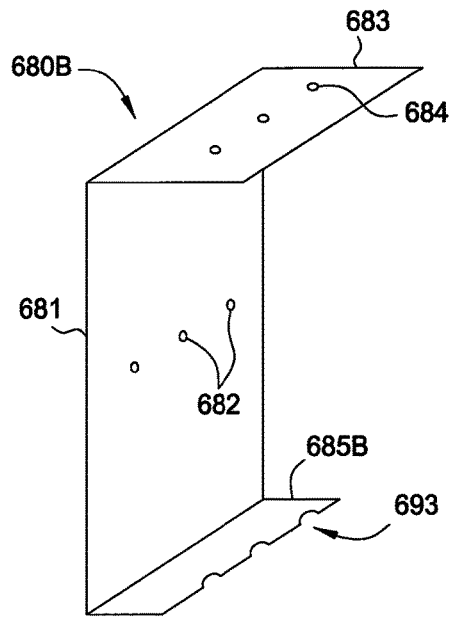

FIG. 6B illustrates an electrically conductive bracket 680B having a shortened lower portion 685B. The distal end of the lower portion 685B has cut-outs 693 to accommodate a tool utilized to secure the electrically conductive bracket

680B. Since the distal end of the lower portion 685B is not removed as far from the plate 681 as compared to the lower portion 685A, the reduction in electric field intensity is not as great as the bracket 680A. However, the electrically conductive bracket 680B still exhibits an electric field intensity about 60 percent less along the outer-most edge of the lower portion 685B compared to an electrically conductive bracket lacking a lower portion 685B (for example, bracket 380 of FIG. 3). Thus, the potential for arcing to occur is greatly reduced by the addition of even a shortened lower portion 685B.

Figure 6C:
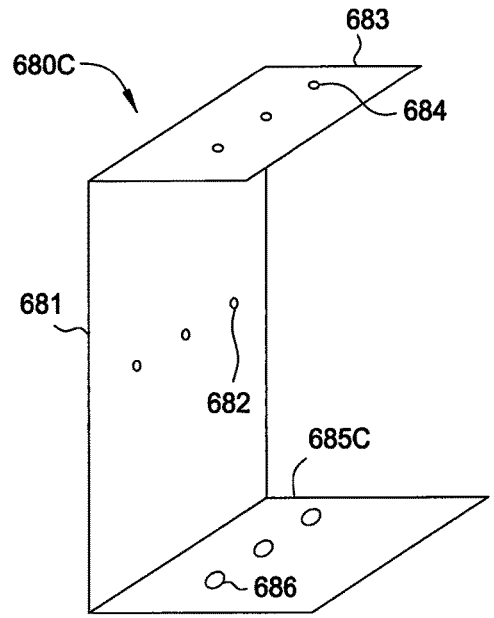

FIG. 6C illustrates an electrically conductive bracket 680C lacking a vertical extension. The lower portion 685C is approximately the same size as the lower portion 685A (FIG. 6A), and greater in size than the lower portion 685B. The electrically conductive bracket 680C exhibits an electric field intensity about 80 percent less along the outer-most edge of the lower portion 685C compared to an electrically conductive bracket lacking a lower portion 685C (for example, electrically conductive bracket 380 of FIG. 3). Thus, the potential for arcing to occur is further reduced by increasing the size of the lower portion 685C. However, the benefit gained by the extra length of the lower portion 685C compared to the length of the lower portion 685B is not linear (e.g., less of a benefit is gained as the size of lower portion 685B is increased). Thus, it can be seen that extending the length of the lower portion 685C provides a diminishing return regarding the reduction of electric field intensity.

Figure 6D:
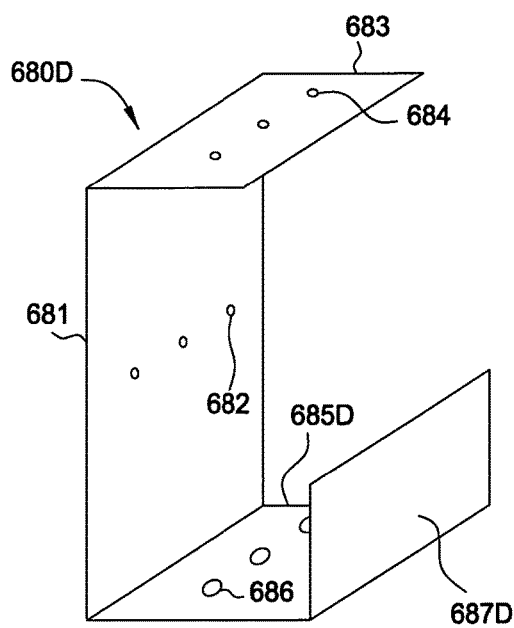

FIG. 6D illustrates an electrically conductive bracket 680D having a lower portion 685D and a shortened vertical extension 687D. The lower portion 685D is approximately the same size as the lower portion 685A (FIG. 6A), while the length of the vertical extension 687D is less than vertical extension 687A (FIG. 6A). The electrically conductive bracket 680D exhibits an electric field intensity about 90 percent less along the upper-most edge of the vertical extension 687D compared to an electrically conductive bracket lacking a lower portion and a vertical extension (for example, electrically conductive bracket 380 of FIG. 3). However, the benefit gained by the vertical extension 687D in addition to the lower portion 685D is only slightly greater than an electrically conductive bracket having only the lower portion 685D (for example, electrically conductive bracket 680C).

Figure 6E:
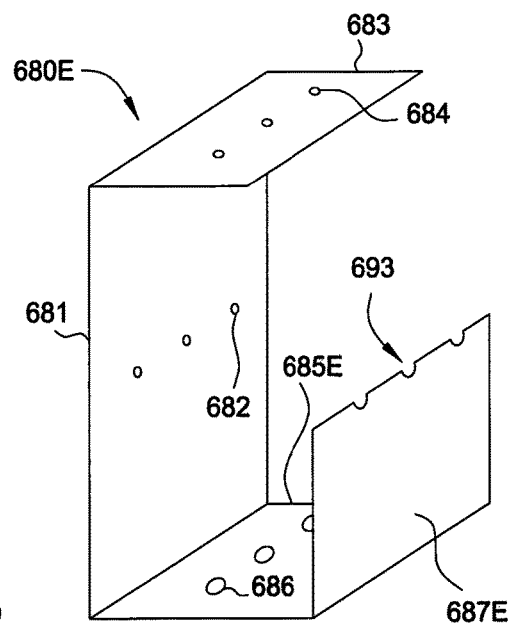

FIG. 6E illustrates an electrically conductive bracket 680E having a lower portion 685E and a shortened vertical extension 687E. The lower portion 685E is approximately the same size as the lower portion 685A (FIG. 6A), while the vertical extension 687E is less than the vertical extension 687A (FIG. 6A). The vertical extension 687E includes cut-outs 693 at one end to allow a tool to access holes 682. The electrically conductive bracket 680E exhibits an electric field intensity about 95 percent less along the upper-most edge of the vertical extension 687E compared to an electrically conductive bracket lacking a lower piece or a vertical extension (for example, electrically conductive bracket 380 shown in FIG. 3). However, the benefit gained by the vertical extension 687E over the vertical extension 687D is only about 5 percent. Thus, the increase in length of the vertical extension provides a diminishing return in the benefit regarding a decrease in electric field intensity. Therefore, the length or size of the lower portion or the vertical extension is not critical, as long as some portion of the bracket is directed away from lower portion of the plate 681 to a location between the plate 681 and a showerhead suspension of similar potential.

Figure 6F:
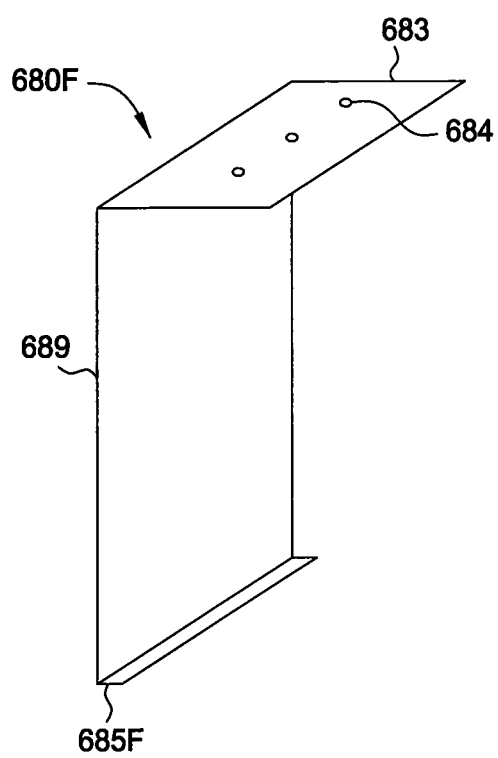

FIG. 6F illustrates an electrically conductive bracket 680F having a lower portion 685F. The lower portion 685F is small enough in size to allow a tool to access holes 684 without requiring cut-outs or holes to be disposed in the lower portion 685F. The width of the lower portion 685F is about 10 percent to about 20 percent of the width of the upper portion 683. The plate 689 is a solid piece of material lacking any holes therethrough. The plate 689 is similar to the plate 681, except that plate 689 lacks the holes 682 of plate 681. Thus, the bracket 680F is held in place by means other than screws or bolts. For example, the bracket 680F may be held in position in a processing chamber by gluing or welding.

Figure 6G:
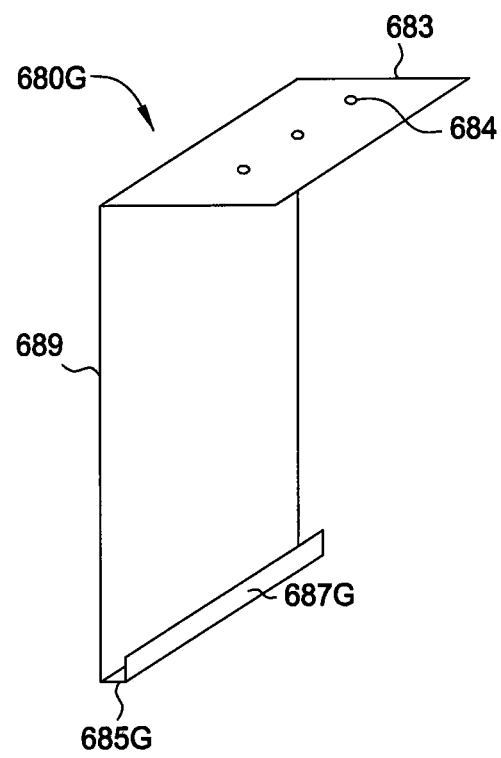

FIG. 6G illustrates an electrically conductive bracket 680G having a lower portion 685G and a vertical extension 687G. The lower portion 685G is small enough in size to allow a tool to access holes 684 without requiring cut-outs or holes to be disposed in the lower portion 685G. The width of the lower portion 685F is about 10 percent to about 20 percent of the width of the upper portion 683. The vertical extension 687G is approximately the same size as the lower portion 685G.

Advantages of the present invention include, but are not limited to the reduction or elimination of parasitic plasma and arcing during substrate processing. The reduction of parasitic plasma or arcing allows for a more efficient and less costly processing of substrates. Additionally, the reduction of parasitic plasma and arcing provides for more uniform processing throughput of substrates. Furthermore, the electrical isolators and the electrically conductive bracket of the present invention allow for lower vacuum and higher RF power processing conditions to be utilized, since these process conditions increase the likelihood of parasitic plasma formation.

While the foregoing is directed to embodiments of the invention, other and further embodiments of the invention may be devised without departing from the basic scope thereof.

We claim:

1. A vacuum processing chamber, comprising:
   a backing plate disposed in a chamber body;
   a showerhead disposed in the chamber body and coupled to the backing plate;
   one or more showerhead suspensions electrically coupling the backing plate to the showerhead;
   an electrically conductive bracket coupled to the backing plate and spaced apart from the showerhead suspension, the electrically conductive bracket comprising a plate positioned substantially perpendicular to a face of the showerhead; and
   an electrical isolator having a first side contacting the plate of the electrically conductive bracket and a second side contacting the chamber body, the electrical isolator positioned radially outward of the electrically conductive bracket.

2. The processing chamber of claim 1, wherein the processing chamber is a PECVD chamber, and the PECVD chamber further comprises an RF source coupled to the backing plate.

3. The processing chamber of claim 1, wherein the electrical isolator comprises ceramic, alumina, or polytetrafluoroethylene.

4. The processing chamber of claim 1, wherein the electrically conductive bracket further comprises:
   a lower portion coupled to a bottom edge of the plate, the lower portion substantially perpendicular to the plate; and a vertical extension coupled to the lower portion, the vertical extension parallel to the plate, wherein the vertical extension has a length less than a length of the plate.

5. The processing chamber of claim 4, wherein the vertical extension includes cut-outs therein to accommodate a tool.

6. The processing chamber of claim 4, wherein the electrically conductive bracket further comprises an upper portion coupled to the plate and positioned substantially parallel to the lower portion.

7. The processing chamber of claim 4, wherein there is substantially no space between the electrically conductive bracket and the electrical isolator.

8. The processing chamber of claim 1, wherein the electrically conductive bracket comprises aluminum.

9. The processing chamber of claim 1, wherein the electrically conductive bracket is flexible.

10. The vacuum processing chamber of claim 1, wherein the electrically conductive bracket is positioned radially outward of the showerhead suspension.

11. A processing chamber, comprising:
a chamber body;
a lid disposed on the chamber body;
a showerhead disposed in the chamber body;
an electrically conductive bracket electrically coupled to the showerhead, the electrically conductive bracket disposed laterally outward of the showerhead and in a spaced apart relation to the showerhead; and
an electrical insulator disposed against a radially-outward surface of the electrically conductive bracket, the electrical insulator positioned radially outward of the electrically conductive bracket, the electrical insulator in contact with the chamber body.

12. The processing chamber of claim 11, further comprising a flexible suspension coupling the showerhead to the lid.

* * * * *